United States Patent
Low et al.

(10) Patent No.: US 7,993,981 B2
(45) Date of Patent: Aug. 9, 2011

(54) ELECTRONIC DEVICE PACKAGE AND METHOD OF MANUFACTURE

(75) Inventors: Qwai Low, Cupertino, CA (US); Patrick Variot, Los Gatos, CA (US)

(73) Assignee: LSI Corporation, Milpitas, CA (US)

( * ) Notice: Subject to any disclaimer, the term of this patent is extended or adjusted under 35 U.S.C. 154(b) by 198 days.

(21) Appl. No.: 12/483,139

(22) Filed: Jun. 11, 2009

(65) Prior Publication Data

US 2010/0314747 A1    Dec. 16, 2010

(51) Int. Cl.
*H01L 21/00* (2006.01)

(52) U.S. Cl. ........ 438/124; 438/126; 438/127; 438/612; 438/613; 438/928

(58) Field of Classification Search .................... 438/928
See application file for complete search history.

(56) References Cited

U.S. PATENT DOCUMENTS

| | | | | |
|---|---|---|---|---|
| 2008/0258273 A1* | 10/2008 | Liang et al. | | 257/666 |
| 2008/0268578 A1* | 10/2008 | Shimanuki et al. | | 438/124 |
| 2009/0034225 A1* | 2/2009 | Shoji et al. | | 361/809 |
| 2009/0053498 A1* | 2/2009 | Matsuura et al. | | 428/220 |
| 2009/0068794 A1* | 3/2009 | Shen et al. | | 438/118 |
| 2009/0068797 A1* | 3/2009 | Shen et al. | | 438/124 |
| 2009/0283882 A1* | 11/2009 | Hsieh et al. | | 257/676 |
| 2010/0129964 A1* | 5/2010 | Goh et al. | | 438/124 |

* cited by examiner

*Primary Examiner* — David E Graybill

(57) ABSTRACT

A method of manufacturing an electronic device package. Coating a first side of a metallic layer with a first insulating layer and coating a second opposite side of the metallic layer with a second insulating layer. Patterning the first insulating layer to expose bonding locations on the first side of the metallic layer, and patterning the second insulating layer such that remaining portions of the second insulating layer on the second opposite side are located directly opposite to the bonding locations on the first side. Selectively removing portions of the metallic layer that are not covered by the remaining portions of the second insulating layer on the second opposite side to form separated coplanar metallic layers. The separated coplanar metallic layers include the bonding locations. Selectively removing remaining portions of the second insulating layer thereby exposing second bonding locations on the second opposite sides of the separated coplanar metallic layers.

10 Claims, 11 Drawing Sheets

Figure 1:
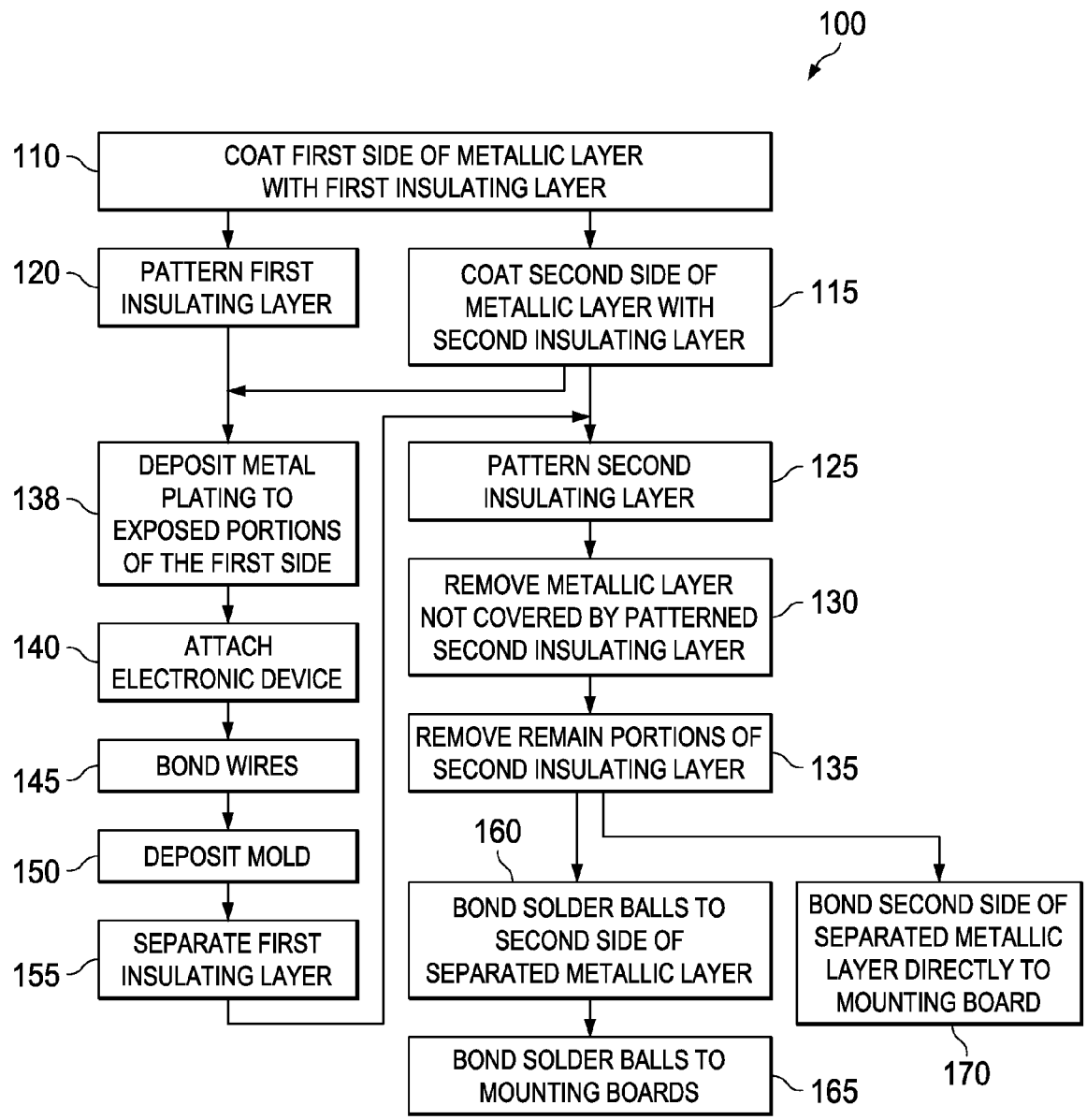

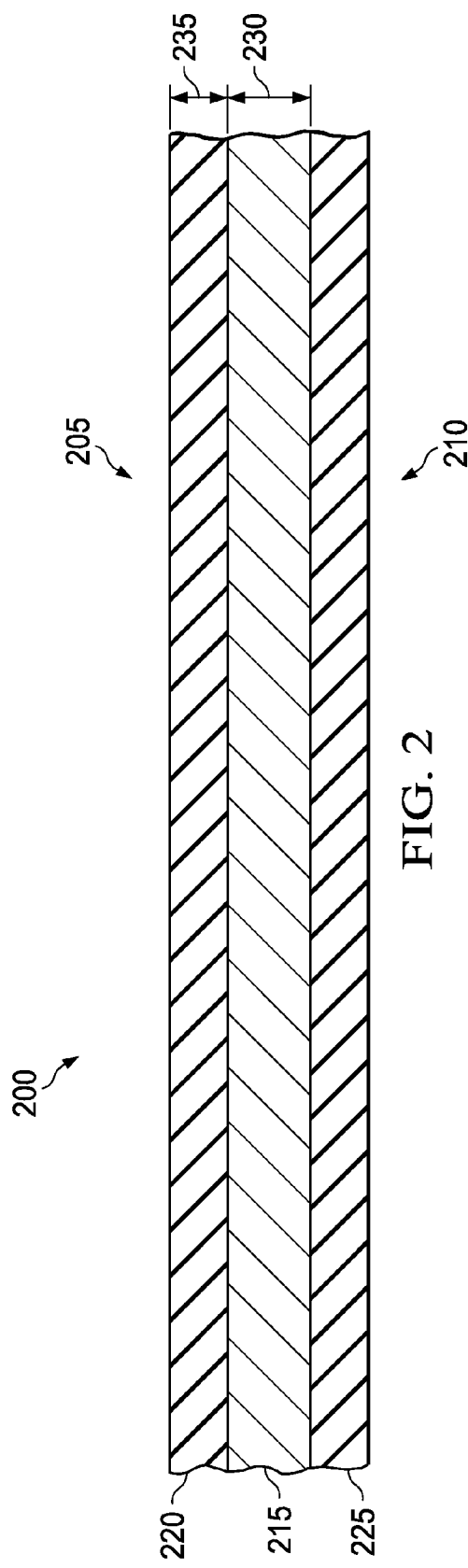
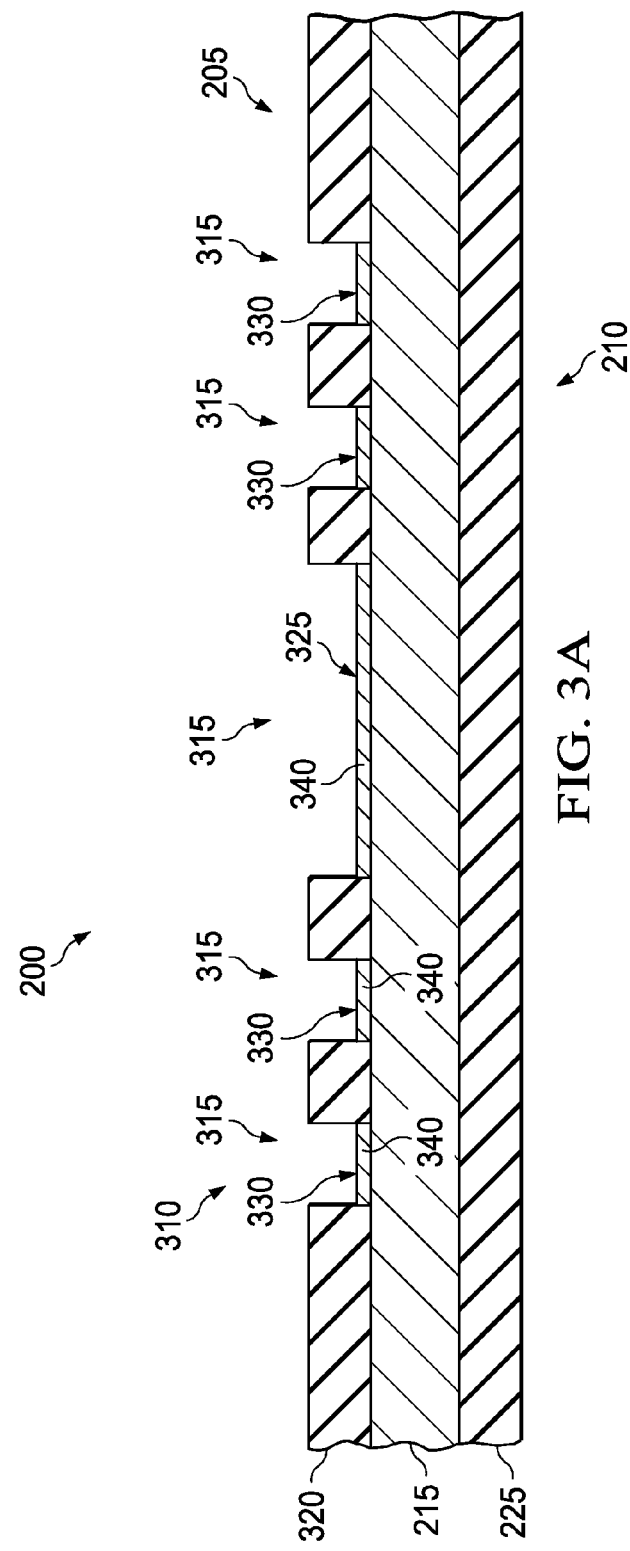
FIG. 2
FIG. 3A

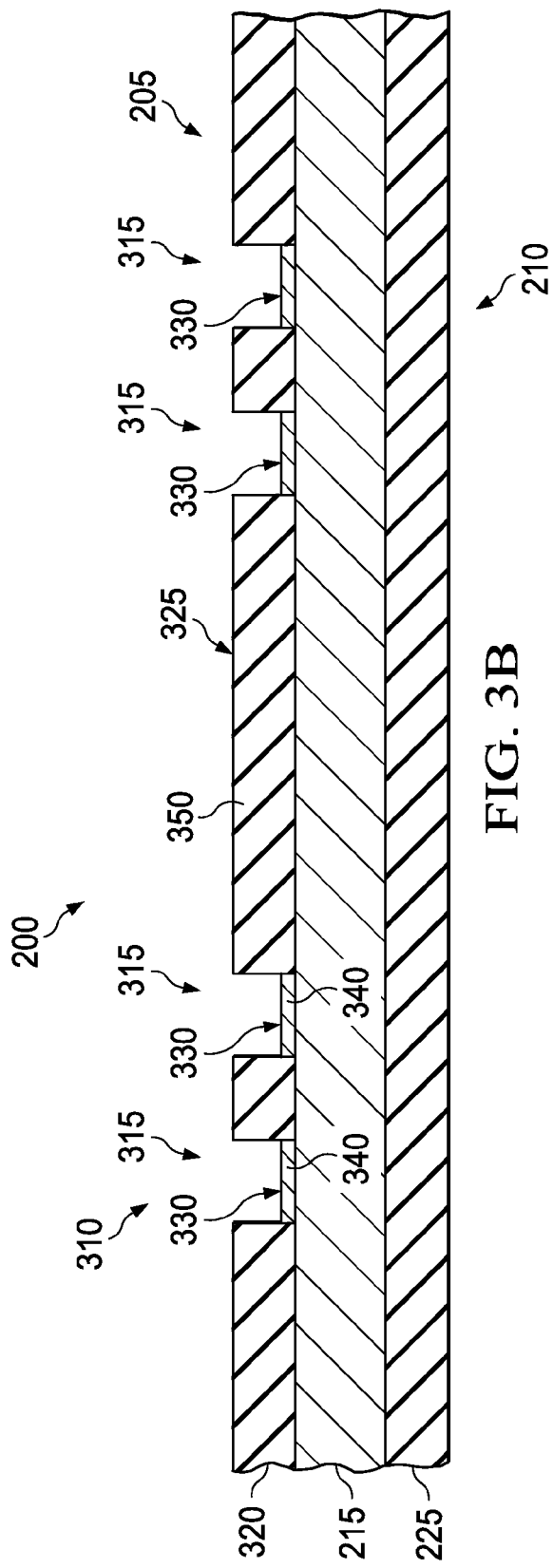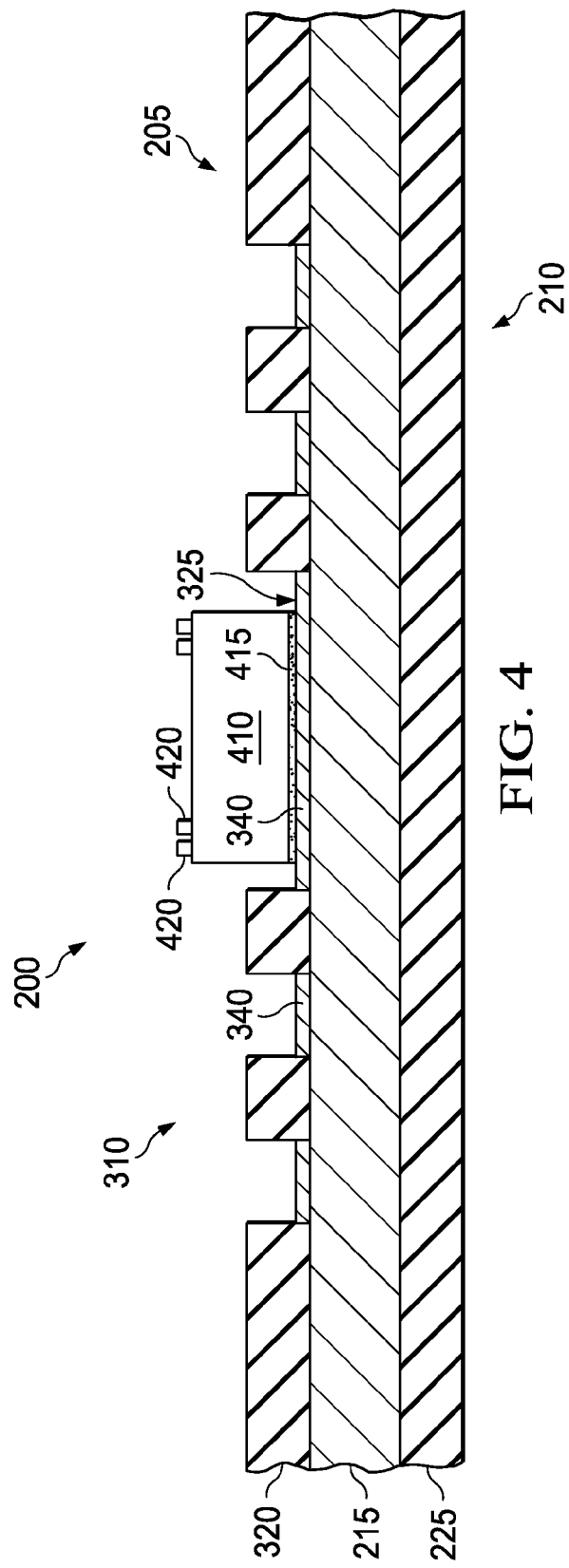

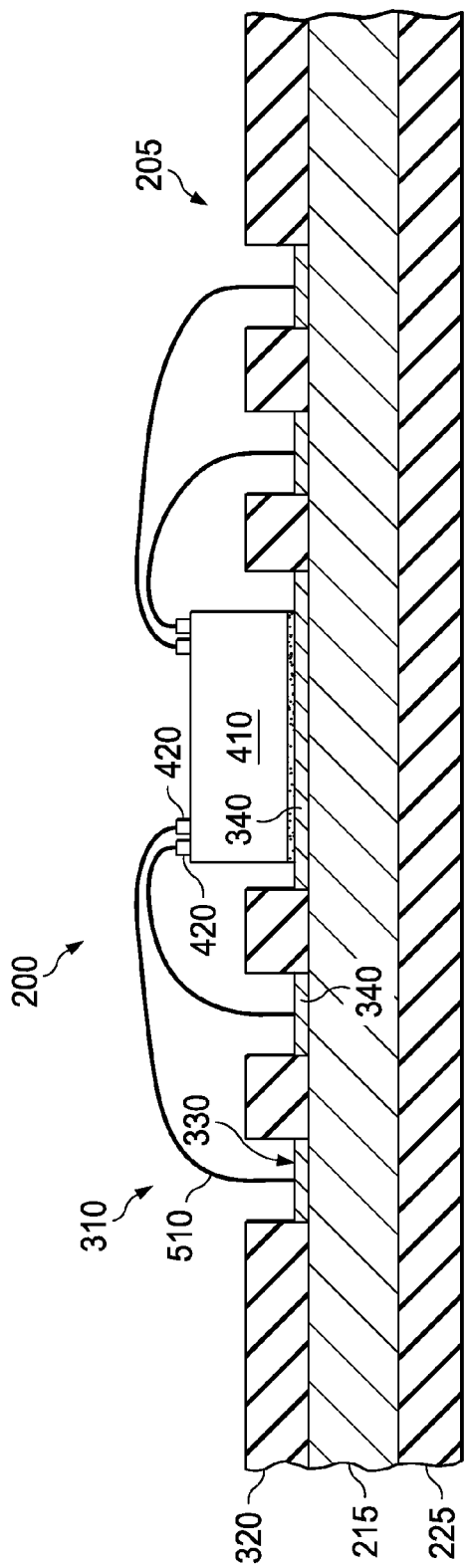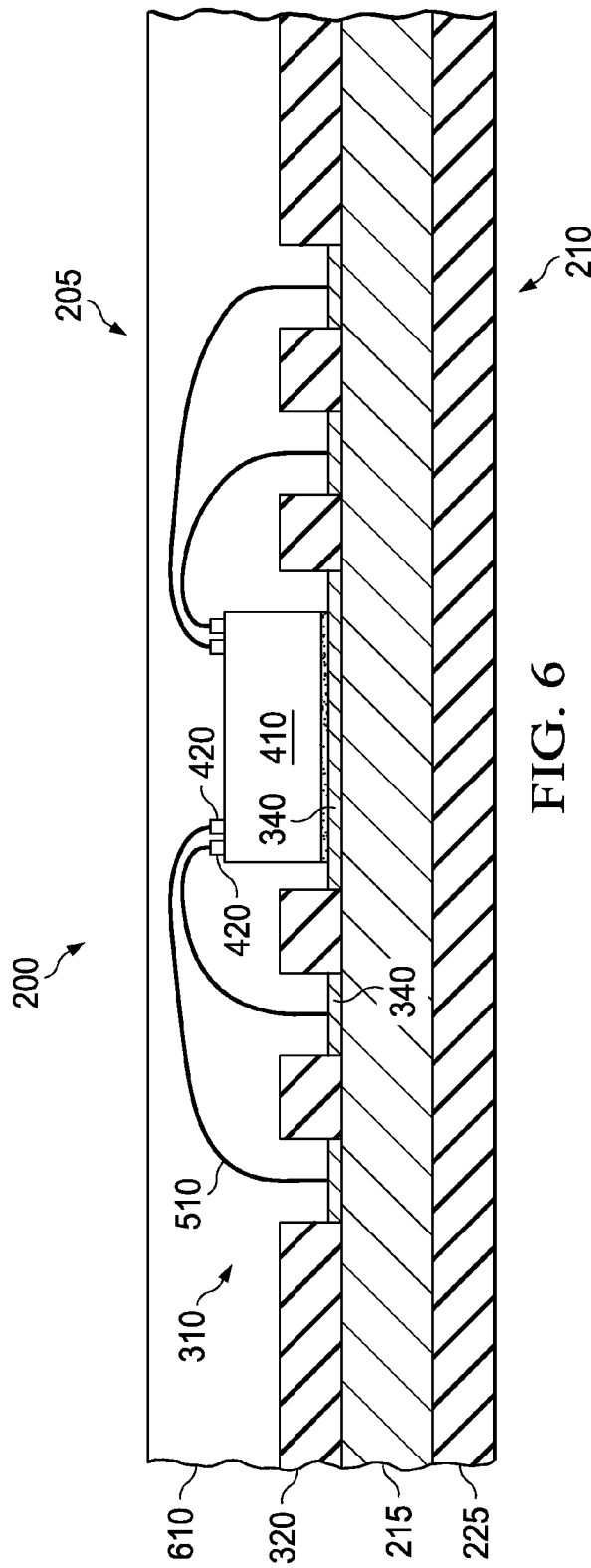

ELECTRONIC DEVICE PACKAGE AND METHOD OF MANUFACTURE

TECHNICAL FIELD

This application is directed, in general, to electronic device packages and their method of manufacture and, more specifically, to device packages with separate metallic bonding layers.

BACKGROUND

Current leadframe base packages include copper traces that are etched in a copper foil. These traces are part of the electrical connection between an integrated circuit (IC) and the outside package peripheral leads. Due to limitations in the etch resolution, these copper traces increase the size of the package in lateral dimensions. The longer the traces, the greater the likelihood of electrical parasitic effects that can interfere with the electrical signals transmitted to and from the IC. Additionally, the patterning of copper traces are often defined by plating the copper foil with an etch-resistant metal (e.g., a nickel-palladium alloy). Such patterning schemes, however, often require multiple masking and plating steps, which in turn, can add to manufacturing costs.

SUMMARY

One embodiment of the disclosure is a method of manufacturing an electronic device package. The method comprises coating a first side of a metallic layer with a first insulating layer and coating a second opposite side of the metallic layer with a second insulating layer. The method further comprises patterning the first insulating layer to expose bonding locations on the first side of the metallic layer, and patterning the second insulating layer such that remaining portions of the second insulating layer on the second opposite side are located directly opposite to the bonding locations on the first side. The method also comprises selectively removing portions of the metallic layer that are not covered by the remaining portions of the second insulating layer on the second opposite side to form separated coplanar metallic layers. The separated coplanar metallic layers include the bonding locations. The method further comprises selectively removing the remaining portions of the second insulating layer thereby exposing second bonding locations on the second opposite sides of the separated coplanar metallic layers.

Another embodiment is an electronic device package. The package comprises an electronic device attached to a first side of one of a plurality of coplanar separated metallic bonding layers configured as a device mounting site. The device also comprises wires bonded to interconnection pads of the electronics device and to the first side of other ones of the separated coplanar metallic bonding layers configured as wire bonding pads. The device further includes an insulating layer that is non-coplanar with the separated coplanar metallic bonding layers. Perimeters of openings in the insulating layer contact perimeters of the coplanar separated metallic bonding layers to which the wires are bonded.

BRIEF DESCRIPTION

Figure 7:
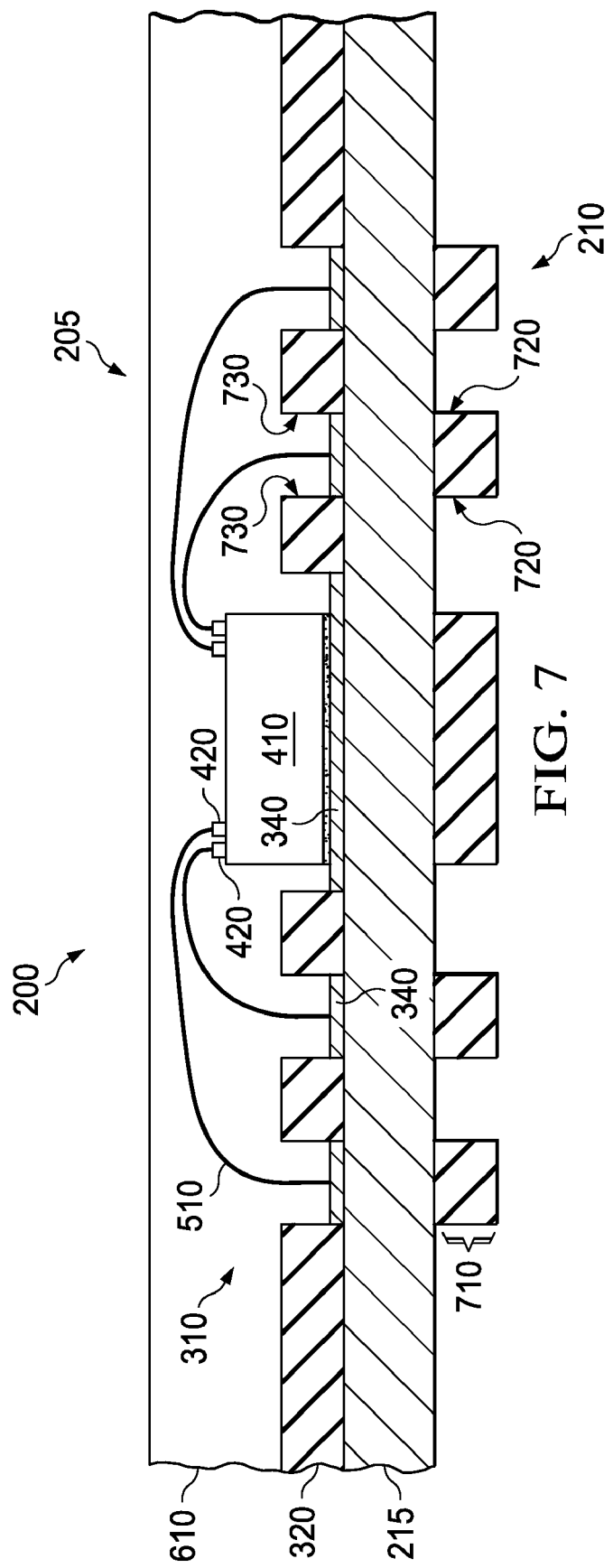
Figure 8:
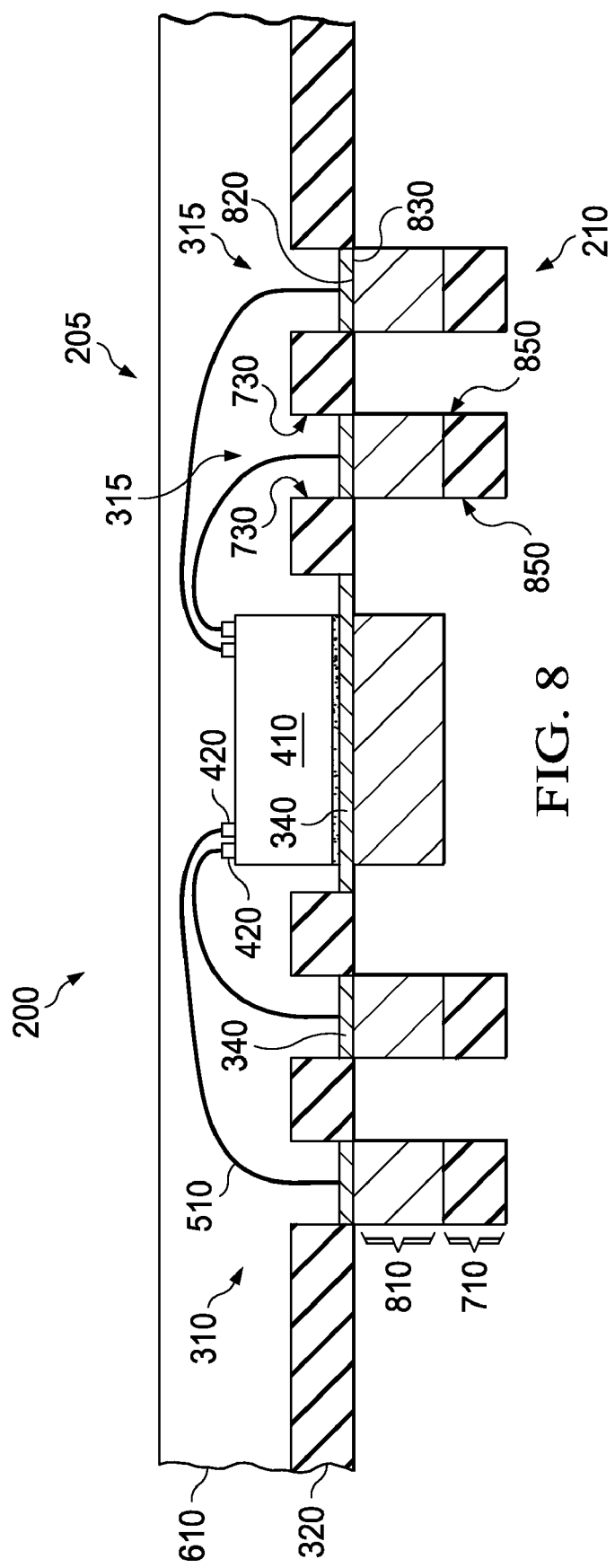
Figure 9:
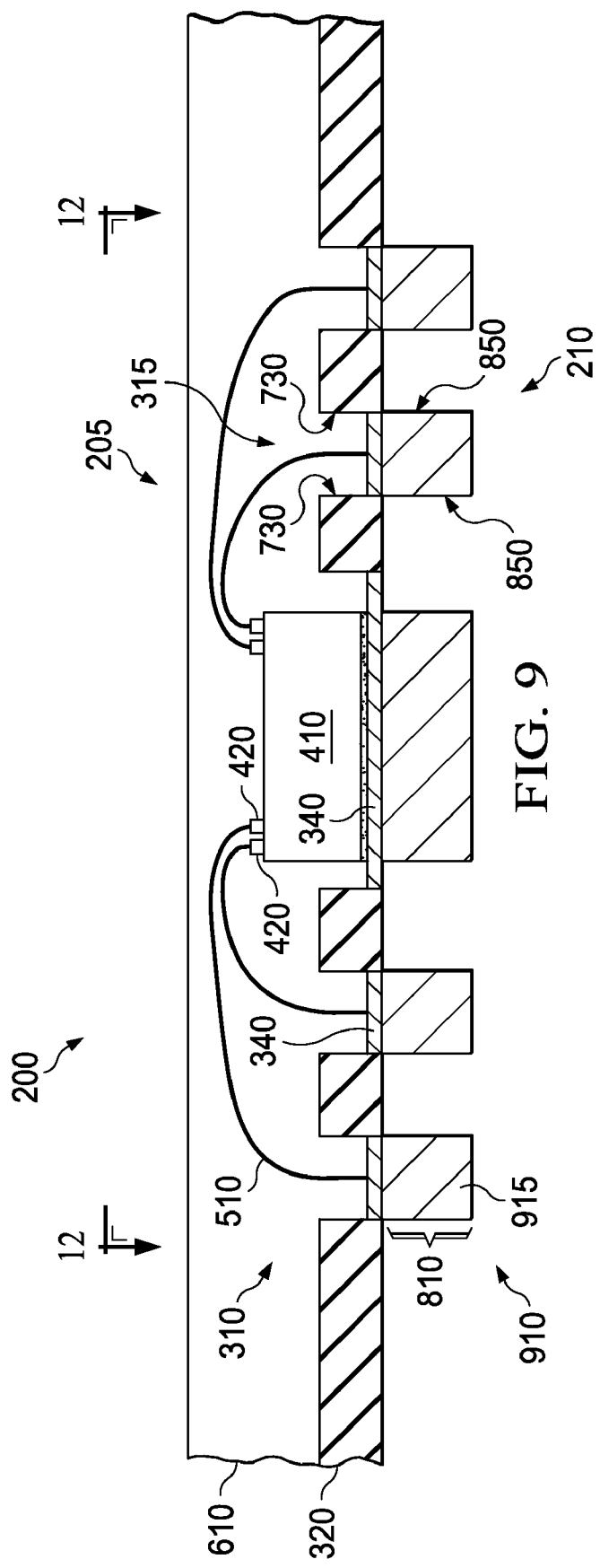
Figure 10:
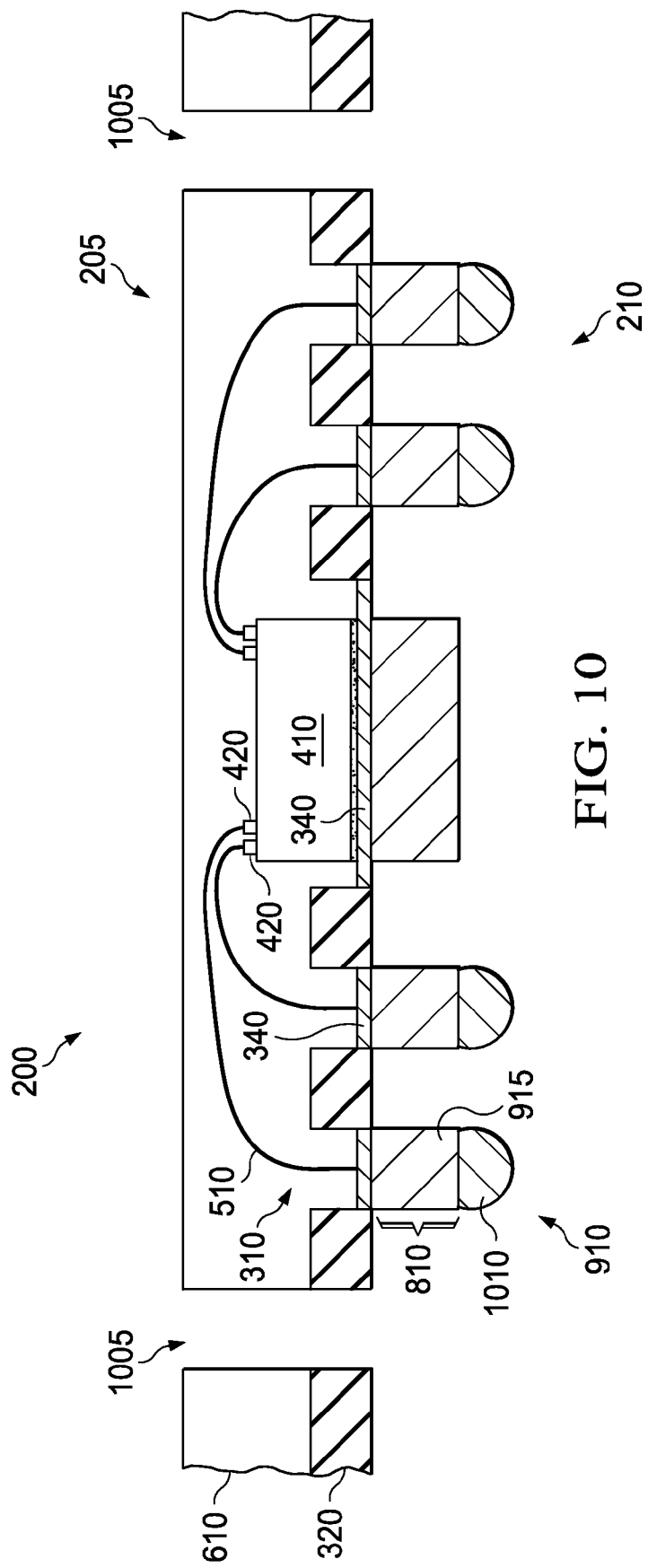
Figure 11A:
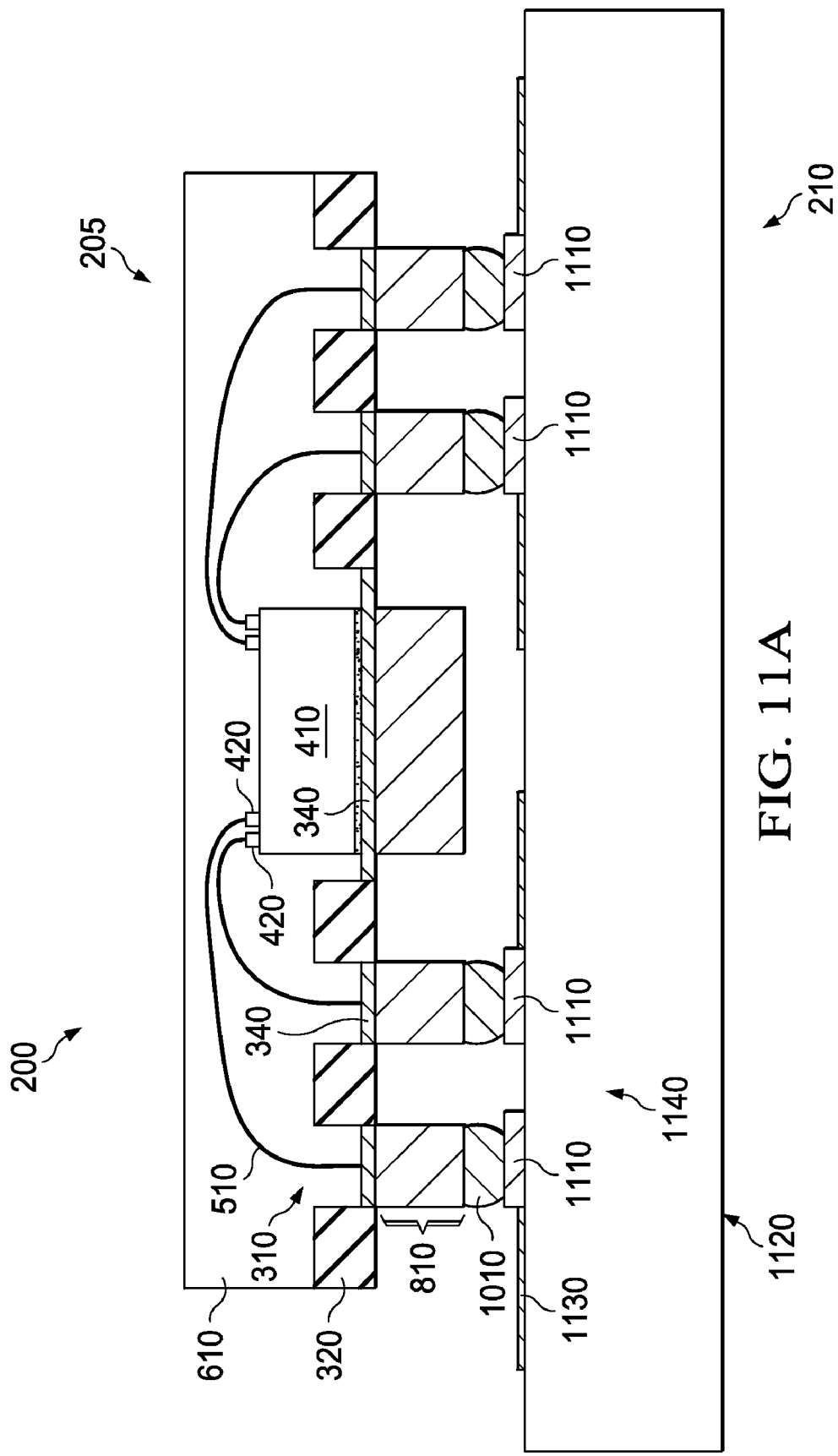
Figure 11B:
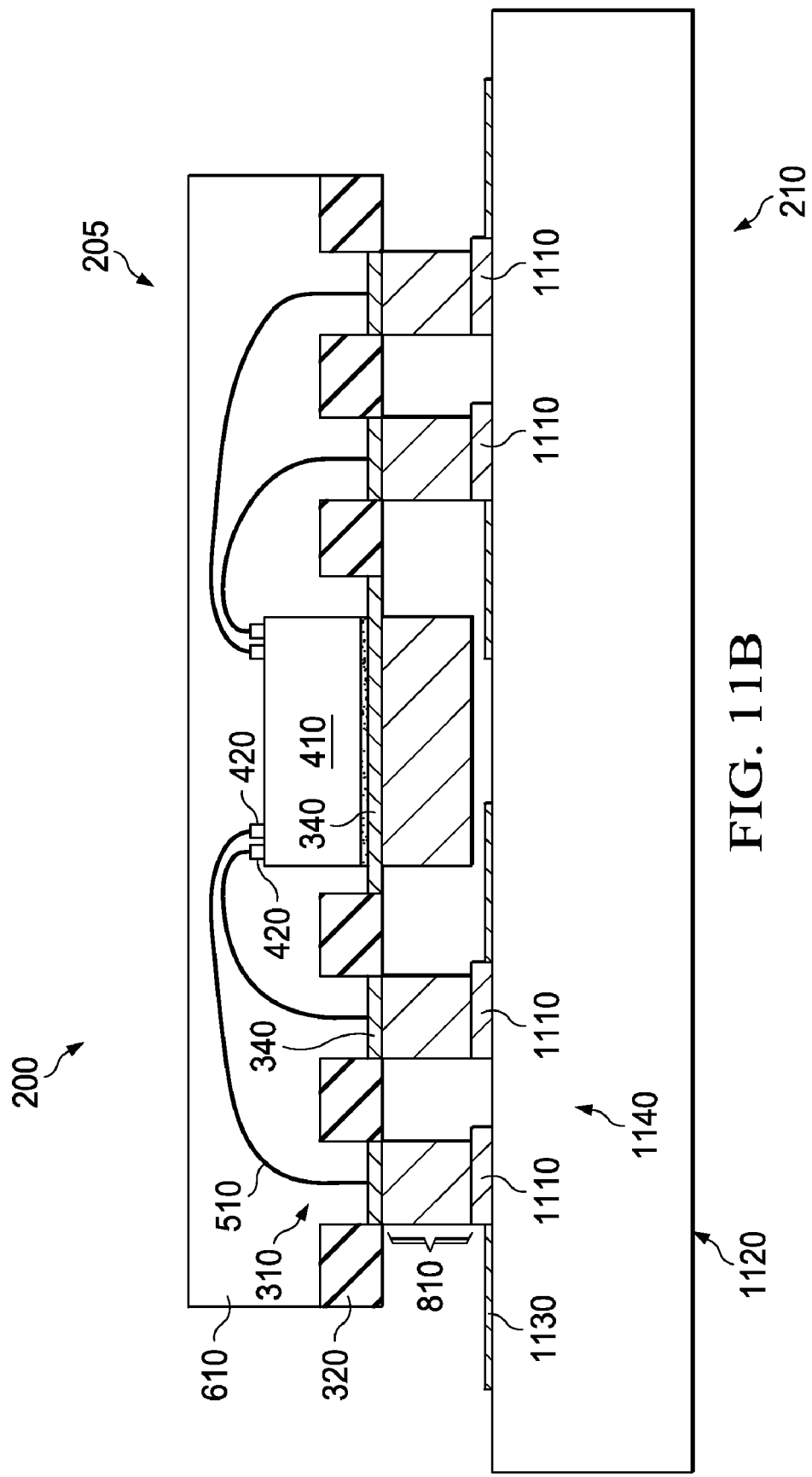
Figure 12:
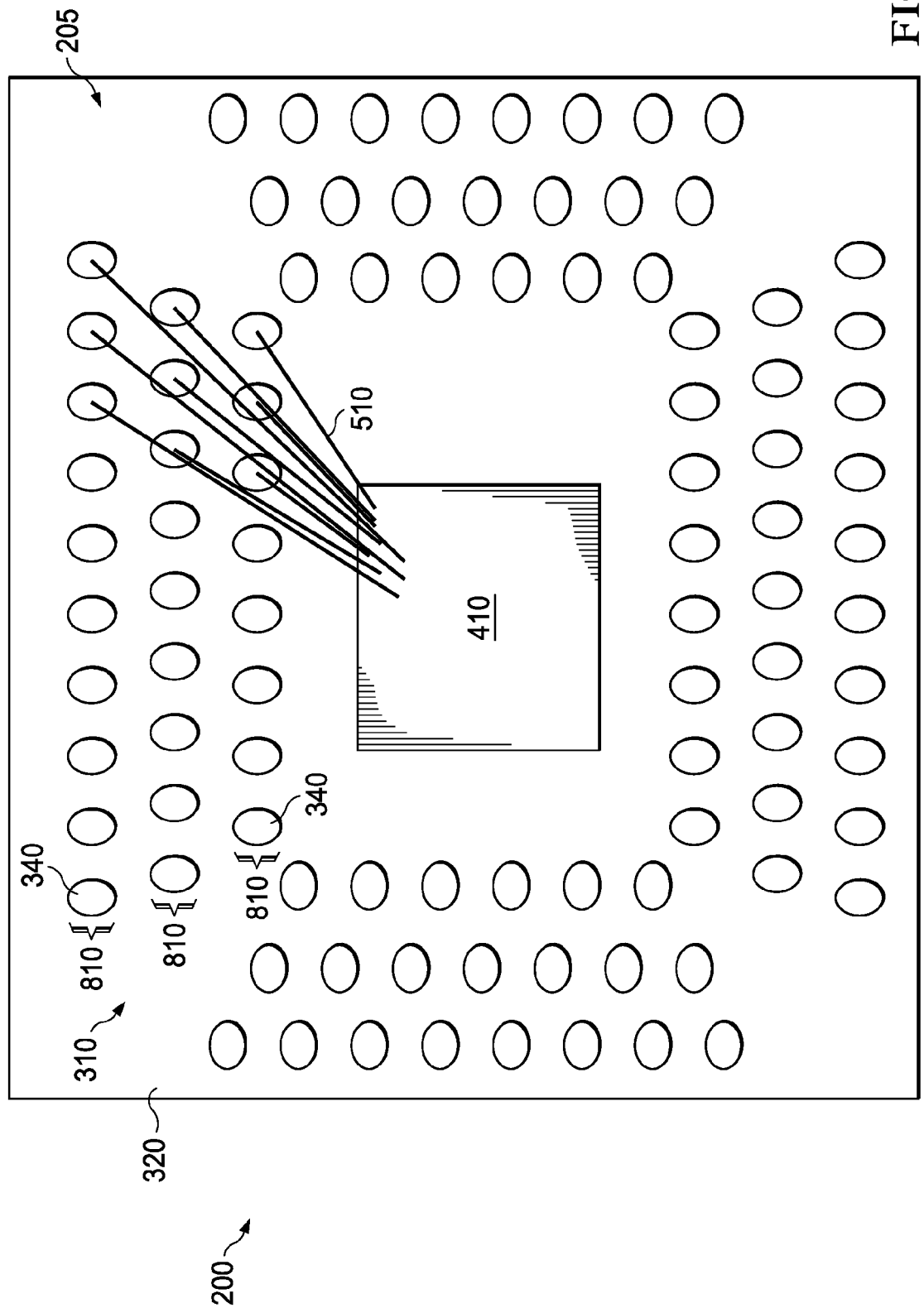

Reference is now made to the following descriptions taken in conjunction with the accompanying drawings, in which:

FIG. 1 presents a flow diagram of an example method of manufacturing an electronic device package in accordance with the disclosure;

FIGS. 2-11B present cross-sectional views of selected steps in the manufacture of an electronic device package of the disclosure, for example, as manufactured by the steps presented in FIG. 1; and FIG. 12 presents a plan view of an example electronic device package of the disclosure, such as the electronic device package presented in FIG. 9.

DETAILED DESCRIPTION

The disclosure provides a method of manufacturing an electronics device package that uses a two-sided patterning process to provide separate metallic layers that have bonding locations separated by an insulating layer. The disclosed method eliminates the need for patterning etch-resistant metals, thereby simplifying and reducing the cost of the manufacturing process. The insulating layer provides structural stability to the package. The use of separated metallic layers in the package helps to deter the occurrence of electrical parasitic effects.

One embodiment of the disclosure is a method of manufacturing an electronics device package. FIG. 1 presents a flow diagram of an example method 100 of manufacturing an electronic device package. The method 100 comprises a step 110 of coating a first side of a metallic layer with a first insulating layer, and a step 115 of coating a second opposite side of the metallic layer with a second insulating layer. The method 100 also comprises a step 120 of patterning the first insulating layer to expose bonding locations on the first side of the metallic layer. The method 100 also comprises a step 125 of patterning the second insulating layer such that remaining portions of the second insulating layer on the second side are located directly opposite to the bonding locations on the first side of the metallic layer. In some cases both sides of the metallic layer are coated with the insulating layers (steps 110, 115) and then the insulating layers are patterned (steps 120, 125). In other cases the first side is coated and the first insulating layer patterned (steps 110 and 120), and then, the second side is coated and the second insulating layer patterned (step 115 and 125). In still other cases, the second insulating layer is not patterned in step 125 until additional steps in the method 100 are performed (e.g., one or more of steps 138 to 155, as discussed below).

The method 100 further comprises a step 130 of selectively removing portions of the metallic layer that are not covered by the remaining portions of the second insulating layer (e.g., the patterned second insulating layer) on the second opposite side to form separated coplanar metallic layers. The separated coplanar metallic layers include the bonding locations. The method 100 also comprises a step 135 of selectively removing the remaining portions of the second insulating layer such that second bonding locations on the second opposite sides of the remaining portions of the separated coplanar metallic layers are exposed.

As further illustrated in FIG. 1, in some embodiments, the method 100 further includes a step 138 of depositing a metal plating layer to at least one of the bonding locations the first side of the metallic layer. The metal plating layer can facilitate subsequent wire bonding to the bonding locations.

As further illustrated in FIG. 1, in some embodiments, the method 100 further includes a step 140 of attaching an electronic device to a device mounting site. In some cases at least one of the bonding locations on the first side of the metallic layer that is configured as a device mounting site. In cases the electronic device is attached to the metal plating deposited on the bonding locations configured as the device mounting site. In other cases the electronic device is attached to a retained portion of the first insulating layer that is on the device mounting site. In some cases, in step 140, a plurality of electronic devices are each attached to different ones of device mounting sites, e.g., located on a metallic layer that is large enough to accommodate the manufacture several packages.

In some embodiments, the method 100 also includes a step 145 of bonding wires from interconnect pads of the electronic device to the bonding locations on the first side of the metallic layer that are configured as configured as wire bonding pads.

The method 100 can further include a step 150 of depositing an insulating mold on the first side of the metallic layer such that the mold covers the electronic device (or devices) and its bonded wires. The method 100 can also include a step 155 of separating the patterned first insulating layer (e.g., formed in step 120) such that the separated ones of the first insulating layer each have a bonding location that is configured as a device mounting site, and in some cases, also has the electronic device attached thereto.

As also illustrated in FIG. 1, in some embodiments, the method 100 can include a step 160 of bonding solder balls to second bonding locations of the second side of the separated coplanar metallic layers that are configured as solder ball bonding pads. In step 165, the solder balls can be bonded to landing pads located on a mounting board. Alternatively, in other embodiments, in step 170, one or more of the second bonding locations are configured as bonding pads that are directly connected to landing pads on a mounting board, without the presence of solder balls.

To further illustrate aspects of the method 100 (FIG. 1), FIGS. 2-11B present cross-sectional views of selected steps in the manufacture of an electronic device package 200 of the disclosure. With continuing reference to FIG. 1, FIG. 2 shows the package 200 after coating first and second sides 205, 210 of a metallic layer 215 with first and second insulating layers 220, 225, in accordance with steps 110 and 115, respectively.

In some cases, the metallic layer 215 includes or is a copper foil, although other metals or metal alloys can be used. In some cases, to provide sufficient rigidity to be compatible with subsequent manufacturing steps, the metallic layer 215 has a thickness 230 that is in a range of about 2 to 150 microns.

In some cases, the first and second insulating layers 220, 225 comprise the same or different patternable materials, such as epoxy-based photoresist materials or other photoresist materials well known to those skilled in the art. One skilled in the art would be familiar with coating processes, such as spin coating, spray coating or dip coating, that could be used to implement steps 110 or 115, to e.g., form uniform and continuous insulating layers 220, 225.

The choice of thickness 235 of the first insulating layer 220 balances the desire for a greater thickness so to impart structural stability to the package 200, versus the desire for a smaller thickness so as not to interfere with subsequent wire bonding to specific bonding locations on the first side 205 of the metallic layer 215. For instance, in some cases, the first insulating layer 220 has a thickness 235 in a range of about 20 to 150 microns. The second insulating layer 225 can have the same or different thickness as the first insulating layer 220.

FIG. 3A shows the package 200 after patterning the first insulating layer 220 (FIG. 2) to expose bonding locations 310 on the first side 205 of the metallic layer 215 in accordance with step 120. One skilled in the art would be familiar with patterning methods that could be used to form openings 315 in the first insulating layer 220 so as to expose the bonding locations 310 according to a predefined interconnection layout pattern. For instance, when the first insulating layer 220 is composed of a photoresist material, discrete portions of the layer 220 can be exposed to electromagnetic radiation (e.g., ultraviolet or visible light) to cause a chemical reaction in the exposed portions. Depending on the type of photoresist material used (e.g., a negative or positive photoresist), the chemical reaction can render the exposed portions of the layer 220 more or less easily removed by a solvent wash, as compared to the non-electromagnetic radiation exposed portions. Removal of the electromagnetic radiation exposed or non-exposed portions of the first insulating layer 220 (FIG. 2) results in a remaining patterned first insulating layer 320 of the first insulating layer 220 having the openings 315 therein.

As shown in FIG. 3A, the remaining patterned insulating layer 320 is non-coplanar with the metallic layer 215 because the first insulating layer 220 was formed on the metallic layer 215.

As further shown in FIG. 3A, some of the bonding locations 310 exposed in step 120 are configured as device mounting sites 325, while other bonding locations 310 are configured as wire bonding pads 330. FIG. 3A also shows the package 300 after depositing a metal plate layers 340 on the bonding locations in accordance with step 138. For instance in some embodiments, the metal plate layer 340 can include, or is, a noble metal such as silver or gold, of a noble metal alloy (e.g., a nickel gold alloy). For instance in some embodiments the metal plate layer 340 can be electrodeposited processes that one skilled in the art would be familiar with. As illustrated in FIG. 3A in some cases the metal plating layers 340 are deposited on bonding locations 310 that are configured as device mounting sites 325 and as wire bonding pads 330.

In other cases, as shown in FIG. 3B, the metal plating layers 340 are deposited on bonding locations 310 configured as wire bonding pads 330, and the device mounting sites 325 includes a retained portion 350 of the insulating layer 320.

FIG. 4 shows the package 200 of FIG. 3A after the step 140 of attaching an electronic device 410 to one of the bonding locations 310 on the first side 205 of the metallic layer 215 that is configured as a device mounting site 325. For instance, an electronic device 410, that includes or is an IC, can be attached to the device mounting site 325 using an adhesive layer 415 such as an epoxy layer. The electronic device 410, can also include interconnect pads 420 to facilitate the electrical connection between the device 410 and other devices of the package 200 or to devices that are external to the package 200. In other embodiments (not shown) the electronic device 410 can be similarly attached to a device mounting site 325 that includes a retained portion 350 of insulating layer 320 (FIG. 3B)

FIG. 5 shows the package 200 of FIG. 4 after the step 145 of bonding wires 510 from the interconnect pads 420 of the electronic device 410 to the bonding locations 310 on the first side 205 that are configured as wire bonding pads 330. One skilled in the art would be familiar with wire bonding processes, such as wedge or bond bonding, that could be used to bond wires 510, such as gold or copper wires, from the interconnect pads 420, and through the openings 315 in the remaining insulating layer 320, to the wire bonding pads 330. The presence of the remaining insulating layer 320 can advantageously help prevent the wiring material from inadvertently contacting more than its target wire bonding pad 330 and thereby causing a short circuit.

FIG. 6 shows the package 200 of FIG. 5 after the step 150 of depositing an insulating mold 610 on the first side 205 of the metallic layer 215 such that the mold 610 covers the electronic device 410 and the wires 510 bonded to the device 410. For instance, the insulating mold 610 can be formed as part of step 150 by injecting an insulating material, such as an epoxy material, into an injection die (not shown) that covers first side 205 and surrounding the devices 410 and its bonded wires 510. The insulating material can then be allowed to solidify before removing the injection die, thereby providing the mold 610.

FIG. 7 shows the package 200 of FIG. 6 after patterning the second insulating layer 225 (e.g., FIG. 6) in accordance with step 125. Patterning in step 125 can be performed using substantially the same procedures as described above in the context of FIG. 3 for the patterning the first insulating layer 205 in accordance with step 120 (FIGS. 1-2). As illustrated in FIG. 7, after the patterning step 125, the remaining portions of the second insulating layer 710 on the second side 210 of the metallic layer 215 are separate from each other and are located directly opposite to the bonding locations 310 exposed on the first side 205, in step 120. For instance, perimeters 720 of the each of the remaining portions of the second insulating layer 710 formed in step 125 are substantially the same as perimeters 730 of the openings 315 that expose the bonding locations 310 via step 120. The remaining portions of the second insulating layer 710 are coplanar with each other, and, are non-coplanar with the metallic layer 215.

As illustrated in FIGS. 1-7, in some cases, the second insulating layer 225 can be patterned in step 125 after metal plating layers 340 are deposited (step 138), the device 410 is attached (step 140), the wires 510 are bonded (step 145) or the mold 610 is deposited (step 150). Retaining the un-patterned second insulating layer 225 can beneficially impart additional structural stability to the package during these any of these steps 138, 140, 145, 150, thereby avoiding distortion or damage to the metallic layer 215. In other cases, however, it is possible to perform patterning of the second insulating layer 225 in step 125 before any of one or all of steps 138, 140, 145, 150. In such cases, the patterned first insulating layer 320 can still provide the desired structural stability to the package during steps 138, 140, 145, 150.

FIG. 8 shows the package 200 after the step 130 of selectively removing portions of the metallic layer 215 (FIG. 7) that are not covered by the remaining portions of the second insulating layer 710 on the second side 210.

One skilled in the art would be familiar with various processes to selectively remove portions of the metallic layer 215. For instance, exposed portions of the metallic layer 215 (e.g., portions not covered by the remaining portions of the second insulating layer 710) can be selectively removed by conventional chemical or electrochemical etching processes.

The remaining portions of the metallic layer 215 (FIG. 7) left after performing step 130 correspond to a plurality of separated coplanar metallic bonding layers 810. The separated coplanar metallic bonding layers 810 can include the bonding locations 310 on the first side 205. As illustrated each of the coplanar metallic bonding layers 810 can include a metal plating layer 340. The bonding locations 310 are separated from each other by the patterned first insulating layer 320. For instance, in some embodiments, at least one edge of one of the openings 315 defined by the patterned first insulating layer 320 (e.g., edge 820) contacts at least one edge of the bonding location 310 of one of the metallic bonding layers 810 (e.g., edge 830). In some cases, a perimeter of one of the openings 315 (e.g., perimeter 730) contacts a perimeter of one of the metallic bonding layers 810 (e.g., perimeter 850).

The coplanar metallic bonding layers 810 are thick enough to permit wire or ball bonding to the layers 810 (e.g., the metal plating layers 340) without distorting the shape of the metallic bonding layers 810. For instance, in some cases, the plurality of separated coplanar metallic bonding layers 810 each have a same thickness 230 (FIG. 2) in a range of about 100 to 150 microns.

As illustrated in FIG. 8, it is desirable for the selective removal process of step 130 to leave the patterned first insulating layer 320 substantially intact (e.g., the thickness 235 (FIG. 2) of the layer 320 is changed by less than 10 percent by the performance of step 130). Keeping the patterned first insulating layer 320 intact can beneficially increase the structural stability of the device package 200 during its manufacture or during the subsequent handling of the completed package. For instance, contacting a perimeter of one of the openings 315 (e.g., perimeter 730) to a perimeter of one of the coplanar metallic bonding layers 810 (e.g., perimeter 850) helps impart structural stability and helps to retain discrete separations between the different bonding locations 310.

FIG. 9 shows the package 200 after the performing the step 135 of selectively removing the remaining portions of the second insulating layer 710 (FIG. 8) such that second bonding locations 910 on the second side 215 are exposed. For the reasons already discussed, it is desirable for the selective removal process of step 135 to leave the patterned first insulating layer 320 substantially intact (e.g., thickness 235 of the layer 320 is altered by less than 10 percent by performing step 135).

One skilled in the art would be familiar with various processes to selectively remove the remaining portions of the second insulating layer 710 in accordance with step 135. For instance, the selective removal step 135 can include different chemicals that are well-known to those skilled in the arts to etch away the electromagnetic radiation-developed, or undeveloped, photoresists.

In some cases, an array of the exposed coplanar metallic bonding layers 810 can form a land grid array (LGA). For instance, at least some of the second bonding locations 910 can be configured as bonding pads 915 of a LGA. In other cases, at least some of the second bonding locations 910 can be configured as solder ball bonding pads 915 as part of a ball grid array (BGA).

FIG. 10 shows the package 200 after the step 155 of separating the patterned first insulating layer 320 such that the separated ones of the layer 320 each include an electronic device 410. One skilled in the art would be familiar with the separation processes that could be used, such as cutting openings 1005, with a saw or laser, in the first insulating layer 320, as well as any intervening metallic bonding layers 810 or the mold 610.

FIG. 10 also shows the package 200 after the step 160 of bonding solder balls 1010 to the second side 210 of the coplanar metallic bonding layers 810 having second bonding locations 910 that are configured as solder ball bonding pads 915. For instance, an array of the metallic bonding layers 810, after performing step 160, can form a BGA. Some embodiments of the disclosed method 100 can eliminate the need to plate the metallic layer 215 with etch-resistant metals, and consequently, the solder balls 1010 can be directly bonded to the remaining portions of the metallic layers 810.

FIG. 11A shows the package 200 after the step 165 of bonding the solder balls 1010 to landing pads 1110 located on a mounting board 1120. For instance, an array of the metallic bonding layers 810 and solder balls 1010, configured as a BGA, can be bonded to an array of the landing pads 1110 via the solder balls 1010. The mounting board 1120 (e.g., a printed circuit board) can have conductive lines 1130 that electrically couple the electronic device 410 of the package 200 to other electronic devices (not shown) on the mounting board 1120 or to devices that are external to the package. In other cases, however, the solder balls 1010 can first be bonded to the landing pads 1110 and then bonded to the bonding pads 915 of the metallic layers 810.

Alternatively as shown in FIG. 11B, the package 200, after separating step 155, can be directly connected to the landing pads 1110, in accordance with step 170, without the presence of solder balls 1010 (FIG. 11A) on the ends of the bonding layers 810. For instance, an array of the metallic bonding layers 810 configured as a LGA can be directly connected to an array of the landing pads 1110.

Another embodiment of the disclosure is an electronic device package. Any of the methods described in the context of FIGS. 1-11B can be used to manufacture packages of the disclosure.

As shown in FIG. 9, the package 200 can comprise an electronics device 410 attached to a first side 205 of one of a plurality of separated coplanar metallic bonding layers 810 (e.g., one configured as a device mounting site 325, FIG. 3). The package 200 further comprises wires 510 bonded to interconnection pads 420 of the device 410 and to the first side 205 of other ones of the plurality of coplanar metallic bonding layers 810 (e.g., ones configured as wire bonding pads 330, FIG. 3). The package 200 also comprises an insulating layer 320 that is non-coplanar with the plurality of separated coplanar metallic bonding layers 810. As discussed in the context of FIG. 8, perimeters 730 of openings 315 in the patterned insulating layer 320 contact perimeters 850 of one of the separated coplanar metallic bonding layers 810.

In some embodiments, the plurality of separated coplanar metallic bonding layers 810 include copper (e.g., portions of a copper foil 215) and a silver or gold-containing metal plating layer 340, the insulating layer 320 includes an epoxy-based photoresist material, the wires 510 include or are composed of gold, and the electronic device 410 includes one or more ICs.

In some cases, as shown in FIG. 9, the package 200 can further include a mold 610 covering the first side 205 of the plurality of coplanar metallic bonding layers 810. As also shown in FIG. 9, the second opposite side 210 of the layers 810 is not covered by the mold 810, thereby allowing the second bonding locations 910 to serve as bonding pads 915, e.g., in LGA or BGA embodiments of the package 200.

FIG. 12 presents a plan view of the electronic device package 200 similar to that presented in FIG. 9 (e.g., using a lower magnification view along view line 12-12 in FIG. 9). As illustrated in FIG. 12, the plurality of coplanar metallic bonding layers 810 of the package 200 that are configured as wire bonding pads 330 can surround the device 410 so as to maximize number of wires 810 that can be connected to the device 410. For clarity, however, only a few wires 510 are depicted in the figure. As illustrated bonding locations 310 configured as wire bonding pads 330 can be substantially circular in shape, although other shapes (e.g., square or rectangular) can be used, if desired.

The use of a plurality of separated coplanar metallic bonding layers 810 of the package 200 can help reduce the occurrence of electrical parasitic effects, as compared to that found in certain device packages that have lead frames with long metal traces. In some embodiments, the plurality of coplanar metallic bonding layers 810 of the package 200 that are configured as wire bonding pads 330 each have a surface area (e.g., on the first side 205) that is less than about 10000 microns$^2$. For instance a square-shaped wire bonding pads 330 preferably has dimensions of about 100 microns by about 100 microns or less. For instance a circular-shaped wire bonding pads 330 preferably has a diameter of about 32 microns or less. In some preferred embodiments, the first side 205 of each wire bonding pad 330 has an area ranging from 25 micron$^2$ to 75 microns. For instance for preferred embodiments of a square-shaped wire bonding pads 330 has dimensions of about 25 microns by about 25 microns to about 75 microns by about 75 microns. The bonding pads 330 could have other shapes, although each preferably have a surface area that is in the same range as the above-described square-shaped pads 330. For instance, some preferred wire bonding pads 330 each have a surface area in a range from about 600 to 5600 microns$^2$.

As illustrated in FIG. 10, some embodiments of the package 200 can further include bonded solder balls 1010. For instance, there can be an array of solder ball bonding pads 915 (e.g., a BGA) bonded to the second sides 210 of each one of the plurality of separated coplanar metallic bonding layers 810 configured as solder ball bonding pads 915. (FIG. 10).

As further illustrated in FIGS. 11A and 11B, in some embodiments of the package 200, the second sides 210 of at least some of the coplanar separated metallic bonding layers 810 can be configured as bonding pads 915 that are bonded to an array 1140 of landing pads 1110 on a mounting board 1120 of the package 200 (e.g., a printed circuit board). As illustrated in FIG. 11A, in some embodiments, a BGA of the solder ball bonding pads 915 can be mounted to the array 1140 of landing pads 1110 on the mounting board 1120. In other embodiments, as illustrated in FIG. 11B, there can be an LGA of solder ball-free bonding pads 915 that contact the array 1140 of landing pads 1110 on the mounting board 1120.

Those skilled in the art to which this application relates will appreciate that other and further additions, deletions, substitutions and modifications may be made to the described embodiments.

What is claimed is:

1. A method of manufacturing an electronic device package, comprising:
   coating a first side of a metallic layer with a first insulating layer;
   coating a second opposite side of said metallic layer with a second insulating layer;
   patterning said first insulating layer to expose bonding locations on said first side of said metallic layer;
   patterning said second insulating layer such that remaining portions of said second insulating layer on said second opposite side are located directly opposite to said bonding locations on said first side;
   selectively removing portions of said metallic layer that are not covered by said remaining portions of said second insulating layer on said second opposite side to form separated coplanar metallic layers, wherein said separated coplanar metallic layers include said bonding locations; and
   selectively removing said remaining portions of said second insulating layer thereby exposing second bonding locations on said second opposite sides of said separated coplanar metallic layers.

2. The method of claim 1, wherein said patterned first insulating layer is non-coplanar with said bonding locations.

3. The method of claim 1, wherein said bonding locations are separated from each other by said patterned first insulating layer.

4. The method of claim 1, wherein a perimeter of one of a plurality of openings in said patterned first insulating layer contacts a perimeter of one of said separated coplanar metallic layers.

5. The method of claim 1, further including attaching an electronic device to at least one of said bonding locations configured as a device mounting site.

6. The method of claim 5, further including bonding wires from interconnect pads of said electronic device to said bonding locations configured as wire bonding pads.

7. The method of claim 6, further including depositing an insulating mold on said first side such that said mold covers said electronic device and said bonded wires.

8. The method of claim 1, further including separating said patterned first insulating layer such that separated ones of said patterned first insulating layer each include at least one of said bonding locations configured as a device mounting site.

9. The method of claim 1, further including bonding solder balls to said second bonding locations that are configured as solder ball bonding pads.

10. The method of claim 1, further including bonding said second bonding locations that are configured as bonding pads to landing pads located on a mounting board.

* * * * *